(12) United States Patent
Extrand

(10) Patent No.: US 6,845,788 B2
(45) Date of Patent: Jan. 25, 2005

(54) FLUID HANDLING COMPONENT WITH ULTRAPHOBIC SURFACES

(75) Inventor: Charles W. Extrand, Minneapolis, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/454,742

(22) Filed: Jun. 3, 2003

(65) Prior Publication Data
US 2004/0206410 A1 Oct. 21, 2004

Related U.S. Application Data
(60) Provisional application No. 60/462,963, filed on Apr. 15, 2003.

(51) Int. Cl.$^7$ ................................................. F15D 1/02
(52) U.S. Cl. ........................................... 138/39; 138/38
(58) Field of Search ..................... 138/38, 39; 244/126, 244/130; 114/67 R

(56) References Cited

U.S. PATENT DOCUMENTS

| | | | | |
|---|---|---|---|---|
| 4,044,797 A | * | 8/1977 | Fujie et al. ................... | 138/38 |
| 4,750,693 A | * | 6/1988 | Lobert et al. ................ | 244/200 |
| 5,052,476 A | * | 10/1991 | Sukumoda et al. .......... | 165/133 |
| 5,070,937 A | * | 12/1991 | Mougin et al. .............. | 165/133 |
| 5,252,835 A | | 10/1993 | Lieber et al. | |
| 5,609,907 A | | 3/1997 | Natan | |
| 5,679,460 A | | 10/1997 | Schakenraad et al. | |
| 5,725,788 A | | 3/1998 | Maracas et al. | |
| 5,900,160 A | | 5/1999 | Whitesides et al. | |
| 5,971,326 A | * | 10/1999 | Bechert ....................... | 244/200 |
| 6,193,191 B1 | * | 2/2001 | Falcimaigne et al. ........ | 244/130 |
| 6,312,303 B1 | | 11/2001 | Yaniv et al. | |
| 6,371,414 B1 | * | 4/2002 | Truax et al. ................. | 244/201 |
| 6,403,388 B1 | | 6/2002 | Birdsley et al. | |
| 6,423,372 B1 | | 7/2002 | Genzer et al. | |
| 6,432,866 B1 | | 8/2002 | Tennent et al. | |

(List continued on next page.)

FOREIGN PATENT DOCUMENTS

| | | |
|---|---|---|
| WO | WO 00/38845 | 7/2000 |
| WO | WO 00/39368 | 7/2000 |
| WO | WO 01/79142 A1 | 10/2001 |
| WO | WO 01/92179 A1 | 12/2001 |
| WO | WO 01/94034 A1 | 12/2001 |
| WO | WO 02/084340 A1 | 10/2002 |

OTHER PUBLICATIONS

Didem Öner et al., *Ultrahydrophobic Surfaces. Effects of Topography Length Scales on Wettability*, Langmuir 2000, Jun. 23, 2000, vol. 16, No. 20, pp. 7777–7782.

(List continued on next page.)

Primary Examiner—James Hook
(74) Attorney, Agent, or Firm—Patterson, Thuente, Skaar & Christensen, P.A.

(57) ABSTRACT

A fluid handling component having a durable ultraphobic fluid contact surface that is capable of exhibiting ultraphobic properties at liquid pressures of one atmosphere and above. The surface generally includes a substrate portion with a multiplicity of projecting regularly shaped microscale or nanoscale asperities disposed so that the surface has a predetermined contact line density measured in meters of contact line per square meter of surface area equal to or greater than a contact line density value "$\Lambda_L$" determined according to the formula:

$$\Lambda_L = \frac{-10{,}330}{\gamma \cos(\theta_{a,0} + \omega - 90°)}$$

where $\gamma$ is the surface tension of the liquid in Newtons per meter, $\theta_{a,0}$ is the experimentally measured true advancing contact angle of the liquid on the asperity material in degrees, and $\omega$ is the asperity rise angle in degrees.

38 Claims, 10 Drawing Sheets

U.S. PATENT DOCUMENTS

| | | |
|---|---|---|
| 6,444,254 B1 | 9/2002 | Chilkoti et al. |
| 6,455,021 B1 | 9/2002 | Saito |
| 6,518,168 B1 | 2/2003 | Clem et al. |
| 6,530,554 B2 | 3/2003 | Shimmo et al. |
| 6,541,389 B1 | 4/2003 | Kubo et al. |
| 6,655,451 B2 * | 12/2003 | Tada et al. .................. 165/179 |
| 2002/0025374 A1 | 2/2002 | Lee et al. |
| 2002/0034879 A1 | 3/2002 | Yun et al. |
| 2002/0114949 A1 | 8/2002 | Bower et al. |
| 2002/0122765 A1 | 9/2002 | Horiuchi et al. |
| 2002/0136683 A1 | 9/2002 | Smalley et al. |
| 2002/0150684 A1 | 10/2002 | Jayatissa |
| 2003/0047822 A1 | 3/2003 | Hori et al. |
| 2004/0081760 A1 * | 4/2004 | Burns et al. ................ 427/269 |

OTHER PUBLICATIONS

Robert H. Dettre et al., *Contact Angle Hysteresis II. Contact Angle Measurements on Rough Surfaces*, Advances in Chemistry Series, Mar. 22, 1963, pp. 136–144.

A.B.D. Cassie et al., *Wettability of Porous Surfaces*, Jun. 19, 1944, pp. 546–551.

C. Rascon et al., *Geometry–dominated fluid adsorption on sculpted solid substrates*, Nature, Oct. 26, 2000, vol. 407, pp. 986–989.

R.G. Cox, *The spreading of a liquid on a rough surface*, J. Fluid Mech., 1983, vol. 131, pp. 1–26.

G. McHale et al., *Analysis of Shape Distortions in Sessile Drops*, Langmuir, 2001, vol. 17, pp. 6995–6998.

A. Esztermann et al., *Triple–Point Wetting on Rough Substrates*, The American Physical Society, Feb. 4, 2002, vol. 88, No. 5, pp. 55702/1–55702/4.

S.G. Mason, *Wetting and Spreading—Some Effects of Surface Roughness*, Academic Press, 1978, pp. 321–326.

H. Kamusewitz et al., *The relation between Young's equilibrium contact angle and the hysteresis on rough paraffin was surfaces*, Elsevier Science B.V., 1999, pp. 271–279.

J.F. Oliver et al., *Liquid spreading on rough metal surfaces*, Journal of Materials Science, 1980, vol. 15, pp. 431–437.

James E. Smay et al., *Colloidal Inks for Directed Assembly of 3–D Periodic Structures*, Langmuir, 2002, vol. 18, pp. 5429–5437.

Darron E. Hill et al., *Functionalization of Carbon Nanotubes with Polystyrene*, Macromolecules, 2002, vol. 35, pp. 9466–9471.

Robert J. Good, *A Thermodynamic Derivation of Wenzel's Modification of Young's Equation for Contact Angles; Together with a Theory of Hysteresis*, Journal of American Chemical Society, Oct. 20, 1952, vol. 74, pp. 5041–5042.

Erdal Bayramli et al., *Tensiometric studies on wetting. I. Some effects of surface roughness (theoretical)*, Canadian Journal of Chemistry, 1981, vol. 59, pp. 1954–1961.

S. Semal et al., *Influence of Surface Roughness on Wetting Dynamics*, Langmuir, 1999, vol. 15, pp. 8765–8770.

J.F. Oliver et al., *The Apparent Contact Angle of Liquids on Finely–Grooved Solid Surfaces—A SEM Study*, Gordon and Breach Science Publishers Ltd., 1977, vol. 8, pp. 223–234.

A.J.G. Allan et al., *Wettability of Perfluorocarbon Polymer Films: Effect of Roughness*, Journal of Polymer Science, 1959, vol. XXXIX, pp. 1–8.

J.B. Sweeney et al., *Equilibrium Thin Films on Rough Surfaces. 1. Capillary and Disjoining Effects*, Langmuir, 1993, vol. 9, pp. 1551–1555.

Wei Chen et al., *Ultrahydrophobic and Ultralyophobic Surfaces: Some Comments and Examples*, Langmuir, 1999, vol. 15, pp. 3395–3399.

Jeffrey P. Youngblood et al., *Ultrahyrophobic Polymer Surfaces Prepared by Simultaneous Ablation of Polypropylene and Sputtering of Poly(tetrafluoroethylene) Using Radio Frequency Plasma*, Macromolecules, 1999, vol. 32, pp. 6800–6806.

Joanna Aizenberg et al., *Direct Fabrication of Large Micropatterned Single Crystals*, SCIENCE, vol. 299, Feb. 21, 2003, pp. 1205–1208.

J.D. Eick et al., *Thermodynamics of Contact Angles*, Journal of Colloid and Interface Science, Nov. 1975, vol. 53, No. 2, pp. 235–248.

F.Y.H. Lin et al., *Effect of Surface Roughness on the Dependence of Contact Angles on Drop Size*, Journal of Colloid and Interface Science, 1993, vol. 159, pp. 86–95.

Peter S. Swain et al., *Contact Angles on Heterogeneous Surfaces: A New Look at Cassie's and Wenzel's Laws*, Langmuir, 1998, vol. 14, pp. 6772–6780.

Kiyoharu Tadanaga et al., *Formation Process of Super–Water–Repellent $Al_2O_3$ Coating Films with High Transparency by the Sol–Gel Method*, Communications of the American Ceramic Society, 1997, vol. 80, No. 12, pp. 3213–3216.

Kiyoharu Tadanaga et al., *Super–Water–Repellent $Al_2O_3$ Coating Films with High Transparency*, Communications of the American Ceramic Society, 1997, vol. 80, No. 4, pp. 1040–1042.

Shuhong Li et al., *Super–Hydrophobicity of Large–Area Honeycomb–Like Aligned Carbon Nanotubes*, Journal of Physical Chemistry, 2002, vol. 106, No. 36, pp. 9274–9276.

J. Kijlstra et al., *Roughness and topology of ultra–hydrophobic surfaces*, Elsevier Science B.V., 2002, vol. 206, pp. 521–529.

Masahide Taniguchi et al., *Effect of Undulations on Surface Energy: A Quantitative Assessment*, Langmuir, 2001, vol. 17, pp. 4312–4315.

David Quere, *Surface Chemistry Fakir droplets*, News & Views, 2002, pp. 14–15.

Masahide Taniguchi et al., *Correcting for Surface Roughness: Advancing and Receding Contact Angles*, Langmuir, 2002, vol. 18, pp. 6465–6467.

M. Thieme et al., *Generation of Ultrahydrophobic Properties of Aluminuim—A First Step to Self–cleaning Transparently Coated Metal Surfaces*, Advanced Engin. Mater., Internet, 2001, vol. 9, pp. 1.

Zen Yoshimitsu et al., *Effects of Surface Structure on the Hydrophobicity and Sliding Behavior of Water Droplets*, Langmuir, 2002, vol. 18, 5818–5822.

David S. Soane et al., *Fluorsight*, Brennan Research Group, Jan. 2003, p. 15.

J.J. Bikerman, *Sliding of Drops From Surfaces of Different Roughness*, pp. 349–359 3/1950.

A.B.D. Cassie, *Contact Angles*, Wool Industries Research Association, Jan. 27, 1948, pp. 11–16.

Eun Hee Cirlin et al., *Roughness and Anisotropy Effects on wettability of Polytetrafluoroethylene and Sodium–treated Polytetrafluoroethylene*, Journal of Polymer Science, 1973, vol. 11, pp. 785–799.

Pulp and Paper Research Institute of Canada, *Liquid Spreading: Edge Effect for Zero Contact Angle*, Journal of Colloid and Interface Science, Aug. 1978, vol. 66, No. 1, pp. 200–202.

Robert N. Wenzel, *Resistance of Solid Surfaces to Wetting by Water*, Industrial and Engineering Chemistry, Aug. 1936, vol. 28, No. 8, pp. 988–994.

Will H. Coghill et al., *Why Water Over–Fills a Tumbler*, Scientific American Supplement, Jul. 27, 1918, vol. 86, No. 2221, pp. 52–53.

R.D. Schulze et al., *Young's equilibrium contact angle on rough solid surfaces. Part I. An empirical determination*, J. Adhesion Sci. Technol., 1989, vol. 3, No. 1, pp. 39–48.

J.F. Oliver et al., *An Experimental Study of Some Effects of Solid Surface Roughness on Wetting*, Colloids and Surfaces, 1980, vol. 1, pp. 79–104.

Kiyoharu Tadanaga et al., *Superhydrophobic–Superhydrophilic Micropatterning on Flowerlike Alumina Coating Film by the Sol–Gel Method*, American Chemical Society, 2000, vol. 12, pp. 590–592.

S. Herminghaus, *Roughness–induces non–wetting*, Europhysics Letters, Oct. 15, 2000, vol. 52, pp. 165–170.

J. Bico et al., *Rough wetting*, Europhysics Letters, Jul. 15, 2001 vol. 55, pp. 214–220.

Randy Doyle Hazlett, *Fractal Applications: Wettability and Contact Angle*, Journal of Colloid and Interface Science, Jul. 1990, vol. 137, No. 2, 527–533.

Y. Tamai et al., *Experimental Study of the Relation between Contact Angle and Surface Roughness*, The Journal of Physical Chemistry, 1972, vol. 76, No. 22, pp. 3267–3271.

J. Kijlstra et al., *Roughness and topology of ultra–hydrophobic surfaces*, Colloids and Surfaces, 2002, vol. 206, pp. 521–529.

Satoshi Shibuichi et al., *Super Water–Repellent Surfaces Resulting from Fractal Structure*, J. Phys. Chem., 1996, vol. 100, pp. 19512–19517.

J. Bico et al., *Pearl drops*, Europhysics Letters, Jul. 15, 1999, vol. 47, No. 2, pp. 220–226.

H. Yildirim Erbil et al., *Transformation of a Simple Plastic into a Superhydrophobic Surface*, Science, Feb. 28, 2002, vol. 299, pp. 1377–1380.

J.D. Miller et al., *Effect of Roughness as Determined by Atomic Force Microscopy on the Wetting Properties of PTFE Thin Films\**, Polymer Engineering and Science, Jul. 1996, vol. 36, No. 14, pp. 1849–1855.

Atsushi Hozumi et al., *Preparation of ultra water–repellent films by microwave plasma–enchanced CVD*, Thin Solid Films, 1997, pp. 222–225.

Brian D. Reiss et al., *DNA–Directed Assembly of Anistropic Nanopaticles on Lithographically Defined Surfaces and in Solution*, Materials Research Society, 2001, vol. 635, pp. C6.2.1–C6.2.6.

F.E. Bartell et al., *Surface Roughness as Related to Hysteresis of Contact Angles.[1] I. The System Paraffin–Water–Air*, J. Phys. Chem., Feb. 1953, vol. 57, pp. 211–215.

F.E. Bartell et al., *Surace Roughness as Related to Hysteresis of Contact Angles. II. The Systems Paraffin–3 Molar Calcium Chloride Solution–Air and Paraffin–Glycerol–Air[1]*. J. Phys. Chem., Apr. 1953, vol. 57, pp. 455–463.

D. Richard et al., *Bouncing water drops*, Europhysics letters, Jun. 15, 2000, vol. 50, pp. 769–775.

Jun Yang et al., *Microfluid Flow in Circular Microchannel with Electrokinetic Effect and Navier's Slip Condition*, Langmuir, 2003, vol. 19, no. 4, pp. 1047–1053.

Neelesh A. Patankar, *On the Modeling of Hydrophobic Contact Angles on Rough Surfaces*, Langmuir, 2003, vol. 19, no. 4, pp. 1249–1253.

Suguru Okuyama et al., *Periodic Submicrocylinder Diamond Surfaces Using Two–Dimensional Fine Particle Arrays*, Langmuir, 2002, vol. 18, No. 22, pp. 8282–8287.

Yoshihito Kunugi et al., *Electro–organic reactions on organic electrodes.*, J. Electroanal. Chem., 1993, vol. 353, pp. 209–215.

C. Huh[1] et al., *Effects of Surface Roughness on Wetting (Theoretical)*, Journal of Colloid and Interface Science, Jun. 1, 1977, vol. 60, No. 1, pp. 11–38.

Letter to the Editors, *Contact Angles by Scanning Electron Microscopy. Silicone Oil on Polished Aluminum*, Journal of Colloid and Interface Science, Feb. 1971, vol. 35, No. 2, pp. 362–364.

Norman R. Morrow, *The Effects of Surface Roughness on Contact Angle with Special Reference to Petroleum Recovery*, The Journal of Canadian Petroleum, Oct.–Dec. 1975, pp. 42–54.

Pascale Aussillous et al., *Liquid Marbles*, Nature, Jun. 21, 2001, vol. 411, pp. 924–896.

Wei Jin et al., *Wetting Hysteresis at the Molecular Scale*, Physical Review Letters, Feb. 24, 1997, vol. 78, No. 8, pp. 1520–1523.

H.J. Busscher et al., *The Effect of Surface Roughening of Polymers on Measured Contact Angles of Liquids*, Colloids and Surfaces, 1984, pp. 319–331.

R. Shuttleworth et al., *The Spreading of a Liquid Over a Rough Solid*, Feb. 23, 1948, pp. 16–22.

J.F. Oliver et al., *Resistance to Spreading of Liquids by Sharp Edges[1]*, Journal of Colloid and Interface Science, May 1977, vol. 59, No. 3, pp. 568–581.

T. Onda et al., *Super–Water–Repellent Fractal Surfaces*, The ACS Journal of Surfaces and Colloids, May 1, 1996, vol. 12, No. 9, pp. 2125–2127.

Phillip G. Wapner et al., *Partial Wetting Phenomena on Nonplanar Surfaces and in Shaped Microchannels*, Langmuir, 2002, vol. 18, No. 4, pp. 1225–1230.

Joonwon Kim et al., *Nanostructured Surfaces for Dramatic Reduction of Flow Resistance in Droplet–Based Microfluidics*, 2002, pp. 479–482.

\* cited by examiner

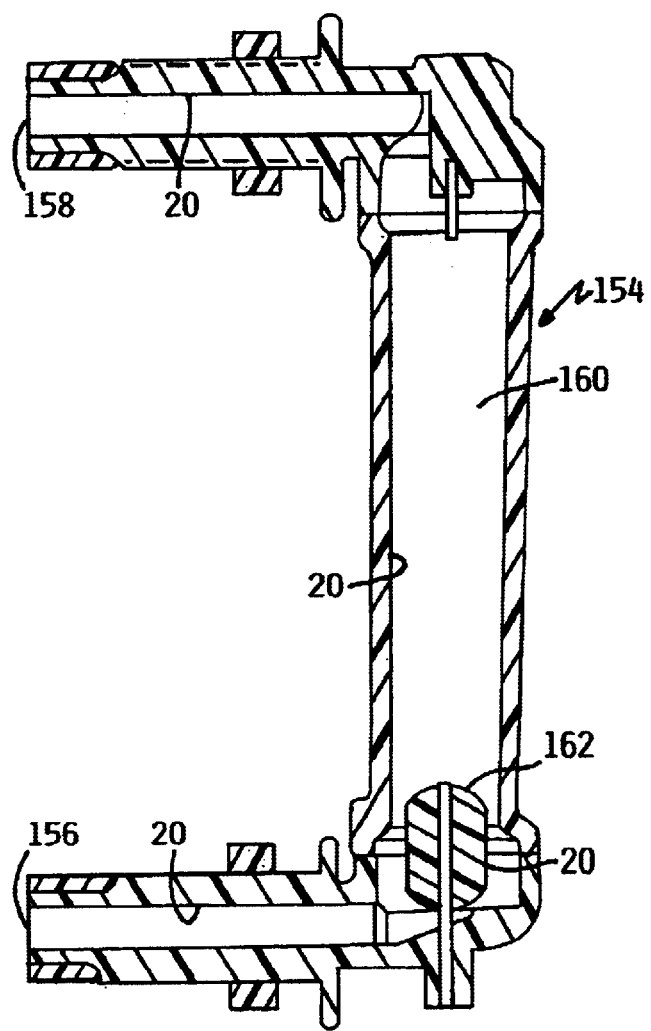
FIG. IF
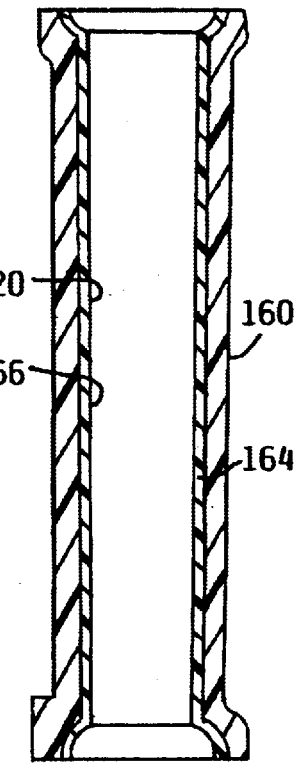
FIG. IG

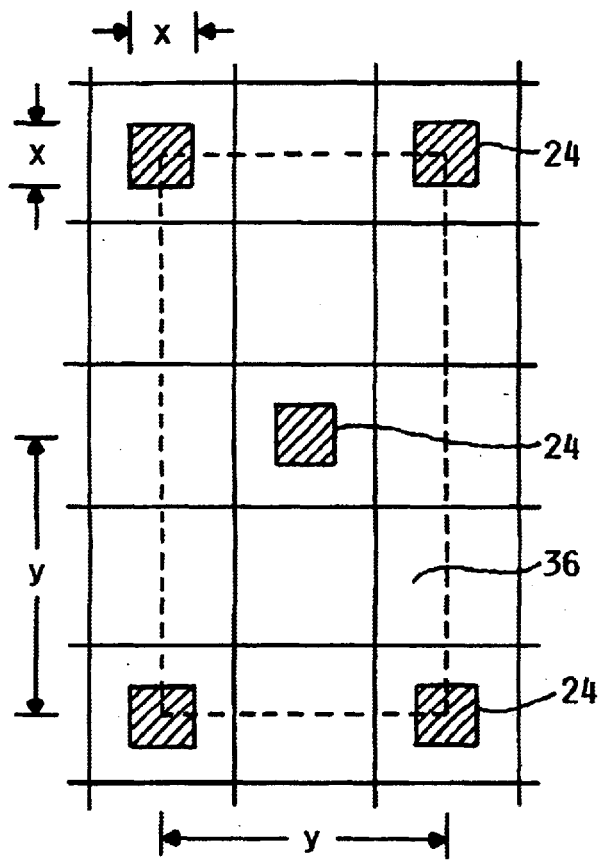
FIG. 4
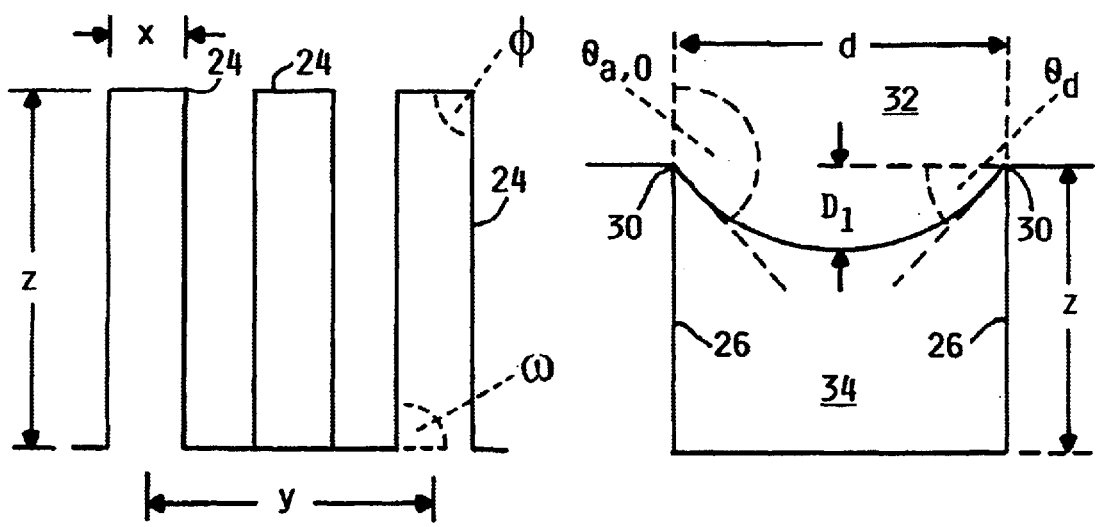
FIG. 5
FIG. 6

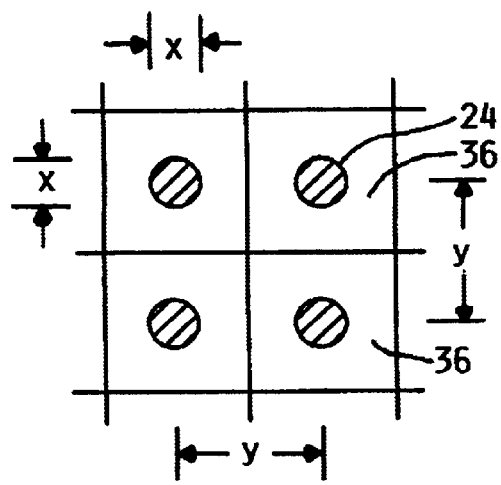
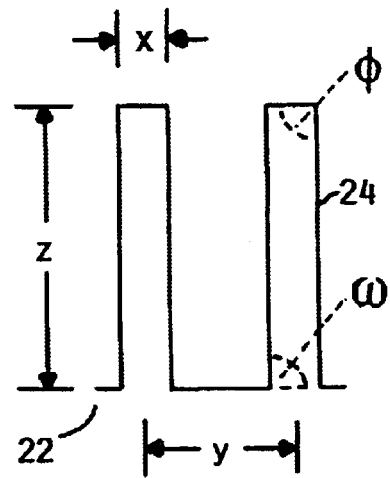
FIG. 11            FIG. 12
| Geometry | $\Lambda$ |
|---|---|
| Hexagonal array of square posts | $4x/y^2$ |
| Cubic array of square posts | $4x/y^2$ |
| Cubic array of circular posts | $\pi x/y^2$ |
FIG. 13

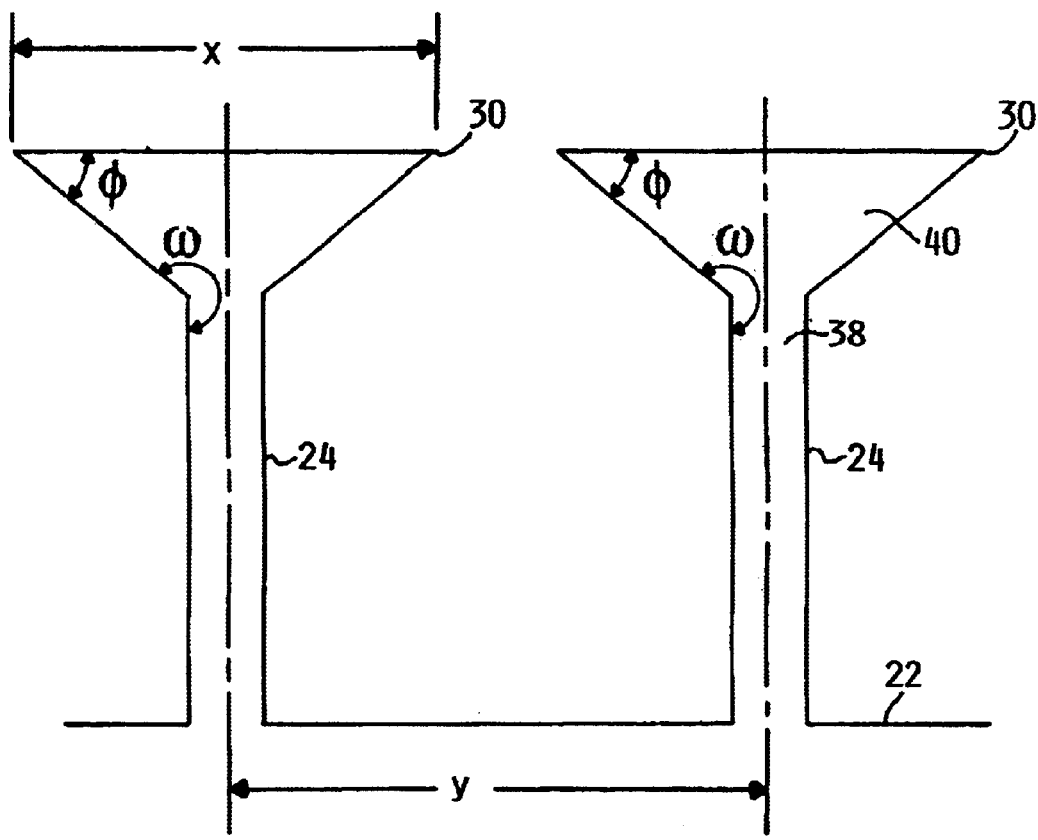
FIG. 14
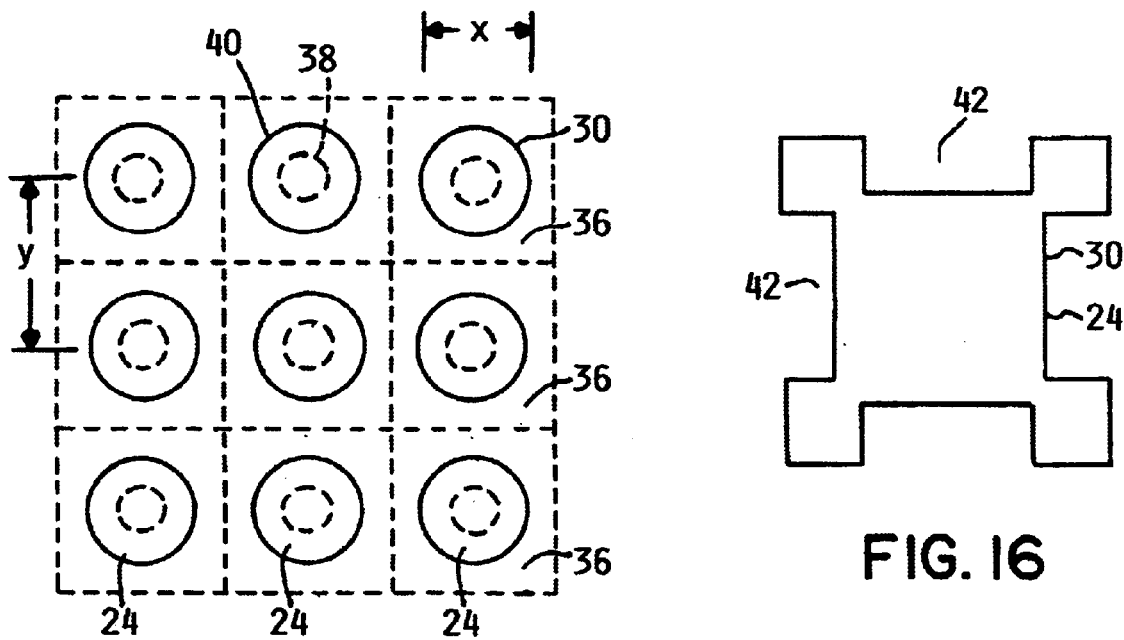
FIG. 15
FIG. 16

FLUID HANDLING COMPONENT WITH ULTRAPHOBIC SURFACES

RELATED APPLICATIONS

This application claims the benefit of U.S. Provisional Patent Application Ser. No. 60/462,963, entitled "Ultraphobic Surface for High Pressure Liquids", filed Apr. 15, 2003, hereby fully incorporated herein by reference.

FIELD OF THE INVENTION

This invention relates generally to fluid handling components, and more specifically to a fluid handling component having ultraphobic fluid contact surfaces.

BACKGROUND OF THE INVENTION

Fluid handling components, such as channels, pipes, tubes and associated fittings and other components have been used for millennia to convey liquids from one place or process to another. Friction of moving fluids with the fluid handling components, however, has always presented a significant challenge to achieving maximum efficiency in fluid handling systems. Friction increases the energy required to pump a fluid through a system and reduces the fluid flow rate through the system.

It is known that the physical characteristics of the fluid contact surfaces of fluid handling components have an effect on friction of the fluid with the components. Generally, for example, smoother surfaces reduce friction, while rougher surfaces increase friction. Also, surfaces made from materials resistant to wetting, such as PTFE, exhibit relatively lower fluid friction. Surfaces that are resistant to wetting by liquids are referred to as "phobic" surfaces. Such surfaces may be known as hydrophobic where the liquid is water, and lyophobic relative to other liquids.

Previous attempts at reducing fluid friction in fluid handling systems have been only partially successful. While fluid friction may be reduced by providing smoother fluid contact surfaces, the amount of reduction achievable is limited. Likewise, the use of conventional materials with improved surface wetting characteristics, such as PTFE, may result in some improvement in friction properties, but the amount of improvement is limited. Also, the choice of materials may be restricted based on the compatibility of the fluid with the materials to be used.

Some recent work has focused on developing special "ultraphobic" surfaces for use in fluid handling applications, particularly in microfluidic applications. Generally, if a surface resists wetting to an extent that a small droplet of water or other liquid exhibits a very high stationary contact angle with the surface (greater than about 120 degrees), if the surface exhibits a markedly reduced propensity to retain liquid droplets, or if a liquid-gas-solid interface exists at the surface when completely submerged in liquid, the surface may be referred to as an ultrahydrophobic or ultralyophobic surface. For the purposes of this application, the term ultraphobic is used to refer generally to both ultrahydrophobic and ultralyophobic surfaces.

Friction between a liquid and a surface may be dramatically lower for an ultraphobic surface as opposed to a conventional surface. As a result, ultraphobic surfaces are extremely desirable for reducing surface friction and increasing flow in a myriad of hydraulic and hydrodynamic applications on a macro scale, and especially in microfluidic applications.

It is now well known that surface roughness has a significant effect on the degree of surface wetting. It has been generally observed that, under some circumstances, roughness can cause liquid to adhere more strongly to the surface than to a corresponding smooth surface. Under other circumstances, however, roughness may cause the liquid to adhere less strongly to the rough surface than the smooth surface. In some circumstances, the surface may be ultraphobic.

Efforts have been made previously at introducing intentional roughness on a surface to produce an ultraphobic surface. The roughened surface generally takes the form of a substrate member with a multiplicity of microscale to nanoscale projections or cavities, referred to as herein as "asperities".

Previous attempts at producing ultraphobic surfaces with micro/nanoscale asperities have been only partially successful. Generally, while the prior art surfaces have exhibited ultraphobic properties under some circumstances relative to liquid droplets carefully placed on the surface, the properties generally disappear when a droplet is impacted with the surface or the surface is submerged in liquid.

Moreover, fluid pressure in fluid handling applications where ultraphobic surfaces may be desirably used often exceeds one atmosphere, and in extreme applications, may reach hundreds of atmospheres. Ultraphobic surfaces produced to date appear to be effective as an ultraphobic surface only up to about 0.1 atmospheres, severely limiting the applicability of such surfaces in fluid handling component applications.

In addition, prior art ultraphobic surfaces are often formed with delicate polymer or chemical coatings deposited on the substrate. These coatings are easily physically damaged, even by fluid pressure, so as to be ineffective. Fluid handing component applications typically require durable fluid contact surfaces so that the component has a reasonable effective life span.

Drainability is also often an important characteristic in fluid handling systems. It is typically necessary to drain most fluid handling systems at some time, whether for maintenance or other reasons. For a variety of reasons, it is generally desirable that as much of the fluid as possible be drained from the system at such times. Moreover, it may be critical that substantially all of the fluid is drained from the system in applications such as semiconductor processing in order to minimize undesirable process contamination.

Often, in conventional fluid handling systems, there is sufficient adhesion between the fluid and the fluid contact surfaces so that individual fluid droplets adhere to the fluid contact surfaces in the system. These droplets are not easily removed, and in a large system, may include a substantial quantity of fluid.

Still needed in the industry are fluid handling components that provide significantly reduced fluid friction characteristics at pressure, combined with improved drainability characteristics.

SUMMARY OF THE INVENTION

The invention includes a fluid handling component having a durable ultraphobic fluid contact surface that is capable of exhibiting ultraphobic properties at liquid pressures of one atmosphere and above. The surface generally includes a substrate portion with a multiplicity of projecting regularly shaped microscale or nanoscale asperities disposed so that the surface has a predetermined contact line density measured in meters of contact line per square meter of surface area equal to or greater than a contact line density value "$\Lambda_L$" determined according to the formula:

$$\Lambda_L = \frac{-10,330}{\gamma \cos(\theta_{a,0} + \omega - 90°)}$$

where γ is the surface tension of the liquid in Newtons per meter, $\theta_{a,0}$ is the experimentally measured true advancing contact angle of the liquid on the asperity material in degrees, and ω is the asperity rise angle in degrees.

The asperities may be formed in or on the substrate material itself or in one or more layers of material disposed on the surface of the substrate. The asperities may be any regularly or irregularly shaped three dimensional solid or cavity and may be disposed in any regular geometric pattern or randomly.

The invention may also include a process for making fluid handling components with fluid contact surfaces having ultraphobic properties at liquid pressures up to a predetermined pressure value. The process includes steps of selecting an asperity rise angle; determining a critical contact line density "$\Lambda_L$" value according to the formula:

$$\Lambda_L = \frac{-P}{\gamma \cos(\theta_{a,0} + \omega - 90°)}$$

where P is the predetermined pressure value, γ is the surface tension of the liquid, and $\theta_{a,0}$ is the experimentally measured true advancing contact angle of the liquid on the asperity material in degrees, and ω is the asperity rise angle; providing a substrate member; and forming a multiplicity of projecting asperities on the substrate so that the surface has an actual contact line density equal to or greater than the critical contact line density.

The asperities may be formed using photolithography, extrusion, nanomachining, microstamping, microcontact printing, self-assembling metal colloid monolayers, atomic force microscopy nanomachining, sol-gel molding, self-assembled monolayer directed patterning, chemical etching, sol-gel stamping, printing with colloidal inks, or by disposing a layer of carbon nanotubes on the substrate. The process may further include the step of determining a critical asperity height value "$Z_c$" in meters according to the formula:

$$Z_c = \frac{d(1 - \cos(\theta_{a,0} + \omega - 180°))}{2 \sin(\theta_{a,0} + \omega - 180°)}$$

where d is the distance in meters between adjacent asperities, $\theta_{a,0}$ is the true advancing contact angle of the liquid on the surface in degrees, and ω is the asperity rise angle in degrees.

It is anticipated that fluid handling components having ultraphobic fluid contact surfaces 20 will exhibit sharply reduced fluid friction characteristics, leading to greatly improved fluid handling system efficiencies and improved fluid flow throughput. Drainability will be greatly enhanced due to the tendency of the surface to suspend droplets, causing them to roll freely by gravity in the direction of any surface slope. The ultraphobic surfaces will be durable, and capable of exhibiting ultraphobic properties under fluid pressures up to the design pressure selected according to the method outlined above.

Other beneficial properties are also anticipated. For example, ultraphobic fluid contact surfaces 20 are anticipated to be resistant to bio-film growth, due to the tendency of the surface to repel liquid water. As a result, the fluid handling components of the present application have applications where inhibition of bio-film growth is desirable, such as for example warm water storage and circulating systems.

BRIEF DESCRIPTION OF THE DRAWINGS

FIG. 1b is a cross-sectional view of the length of tubing depicted in FIG. 1a;

FIG. 1f is a sectional view of an in-line flowmeter component according to the present invention;

FIG. 1g is a sectional view of an in-line flowmeter sight tube according to the present invention;

FIG. 4 is a partial top plan view of an alternative embodiment of the present invention wherein the asperities are arranged in a hexagonal array;

FIG. 5 is a side elevation view of the alternative embodiment of FIG. 4;

FIG. 6 is a side elevation view depicting the deflection of liquid suspended between asperities;

FIG. 11 a partial top plan view of an alternative embodiment of the present invention wherein the asperities are cylindrical and are arranged in a rectangular array;

FIG. 12 is a side elevation view of the alternative embodiment of FIG. 11;

FIG. 13 is a table listing formulas for contact line density for a variety of asperity shapes and arrangements;

FIG. 14 is a side elevation view of an alternative embodiment of the present invention;

FIG. 15 is a top plan view of the alternative embodiment of FIG. 14; and

FIG. 16 is a top plan view of a single asperity in an alternative embodiment of the present invention.

DETAILED DESCRIPTION OF THE INVENTION

For the purposes of the present application, the term "fluid handling component" refers broadly to pipe, tubing, fittings, valves, flowmeters, tanks, pumps, and any other device or component that may be used to handle, transport, contain, or convey a fluid. The term "fluid contact surface" refers broadly to any surface or portion thereof of a fluid handling component that may be in contact with a fluid. The term "fluid handling system" refers to any fluidly interconnected arrangement of fluid handling components.

Figure 1A:
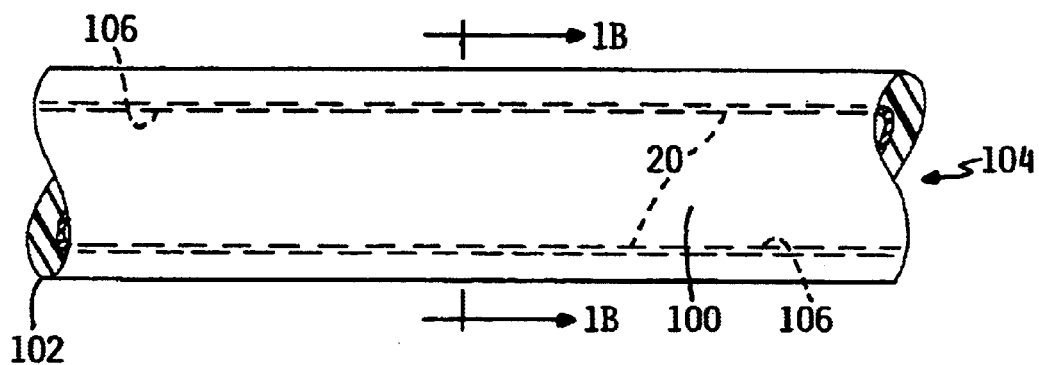
FIG. 1a is a partial longitudinal sectional view of a length of tubing with an ultraphobic fluid contact surface according to the present invention.
Figure 1B:
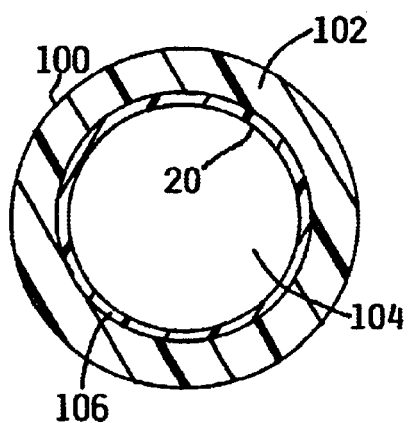

Various embodiments of fluid handling components according to the present invention are depicted in FIGS. 1a–1g. In FIGS. 1a and 1b, a length of tubing 100 has a body 102 with a bore 104 defined therethrough. Substrate layer 106 is disposed so as to line bore 104. Ultraphobic fluid contact surface 20 is formed on substrate layer 106 and faces inwardly so as to contact fluid flowing through bore 104. Substrate layer 106 may be applied to body 102 by film insert molding as disclosed in co-pending U.S. patent application Ser. No. 10/304,459, entitled "Performance Polymer Film Insert Molding for Fluid Control Devices", commonly owned by the owners of the present invention and hereby incorporated fully by reference herein. Although a separate substrate layer 106 is depicted in the embodiment of FIGS. 1a and 1b, it will be readily appreciated that in other embodiments, body 102 may serve as the substrate, with ultraphobic fluid contact surface 20 formed directly on an inwardly facing surface thereof. It will also be appreciated that ultraphobic fluid contact surface may run the entire length of tubing 100 or may be selectively positioned at any desired point where flow conditions may be critical.

Figure 1C:
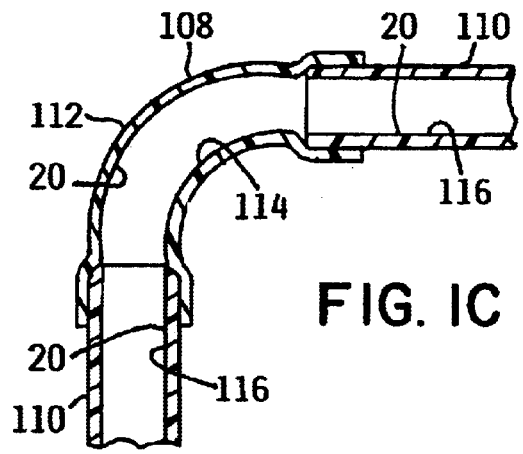
FIG. 1c is a partial longitudinal sectional view of a 90 degree elbow fitting according to the present invention connecting two sections of pipe.

Another embodiment of a fluid handling component in the form of a 90 degree elbow fitting 108 connecting two lengths of pipe 110 is depicted in FIG. 1c. Elbow fitting 108 has a body portion 112 with ultraphobic fluid contact surface 20 directly on inner surface 114. The inner surface 116 of each pipe 118 may also be an ultraphobic contact surface 20. It will, of course, be readily appreciated that ultraphobic fluid contact surface 20 may be provided on pipe, tubing, fittings and channels of any shape or size. For example, although a 90 degree elbow fitting is depicted in FIG. 1c herein, other fittings such as sweep elbows, tees, wye and sanitary fittings, manifolds and the like may also be provided with ultraphobic fluid contact surfaces according to the present invention.

Figure 1E:
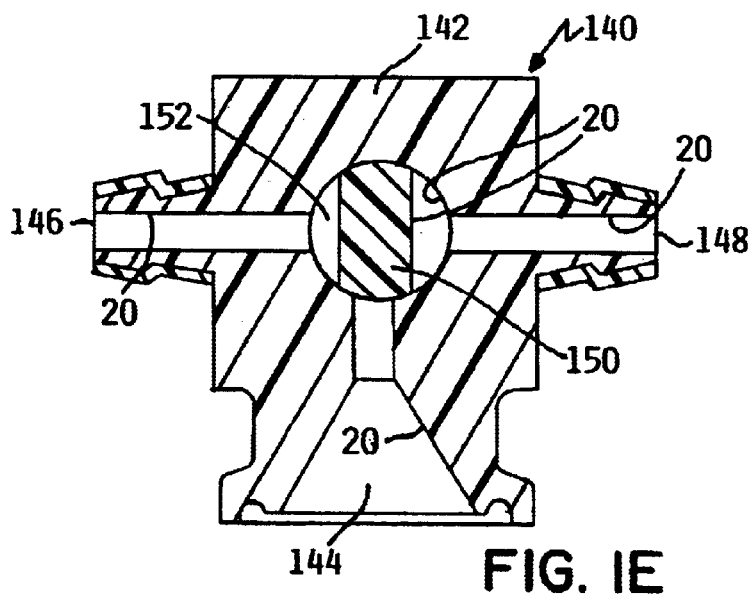
FIG. 1e is a sectional view of a three-way valve component according to the present invention.
Figure 1D:
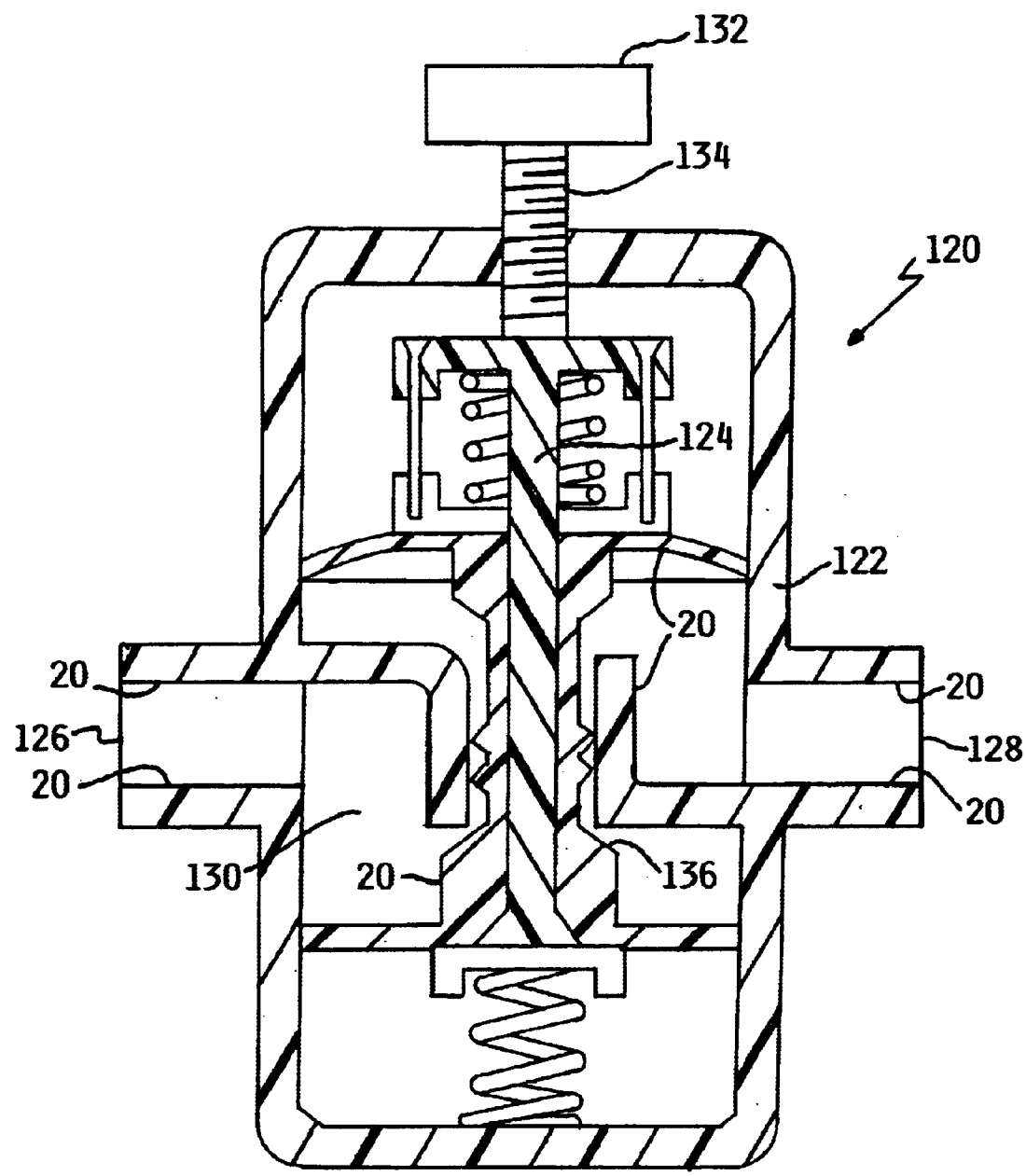
FIG. 1d is a sectional view of a two-way valve component according to the present invention.

In addition, other more complex fluid handling components, such as two-position valve 120 depicted in FIG. 1d, may be provided with ultraphobic fluid contact surfaces 20. Two-position valve 120 generally includes a valve body 122 and a valve stem 124. Valve body 122 generally includes an inlet port 126 and an outlet port 128 connected by a continuous flow channel 130. Valve stem 124 includes a handle 132, a rod 134 and a sealing face 136. Ultraphobic fluid contact surface 20 may be formed on the entire wetted surface of two-position valve 120 including inlet port 126, outlet port 128 and flow channel 130 or any desired portion thereof. Ultraphobic fluid contact surface 20 may also formed on the wetted portions of valve stem 134.

Another alternative embodiment of a fluid handling component 138 is depicted in FIG. 1e. In FIG. 1e, a three-position valve 140 includes a valve body 142 having an inlet port 144, a first outlet port 146 and a second outlet port 148. Three-position valve 140 also includes a valve stem 150 within a central bore 152. First outlet port 146 and second outlet port 148 are configured having barbed ends facilitating interconnection to the remainder of a fluid circuit. Again, ultraphobic fluid contact surface 20 may be formed over the entire wetted surface of valve body 142 and valve stem 150, or selectively on any portion thereof.

It will be evident that ultraphobic fluid contact surface 20 may be applied to any valve configuration. These configurations could include any number of inlet and outlet ports, all variety of valve connections including male and female, threaded style connectors and, sanitary connectors. In addition, ultraphobic fluid contact surfaces according to the present invention may be selectively applied to the wide variety of valve stems including those used in ball valves, gate valves, and diaphragm valves.

As depicted in FIGS. 1f and 1g, the fluid handling component may be in the form of a flowmeter assembly 154. Flowmeter assembly 154 generally includes an inlet port 156, an outlet port 158, a sight tube 160 and a float 162. In the depicted embodiment, ultraphobic fluid contact surface 20 is formed on all wetted surfaces of flowmeter assembly 154. In the alternative embodiment depicted in FIG. 1g, sight tube 160 has an interior substrate layer 164, with the ultraphobic fluid contact surface 20 on the interior surface 166 of substrate layer 164. It will be appreciated that ultraphobic fluid contact surfaces 20 may be applied to any type of fluid monitoring apparatus, including flowmeters having sensors for transmitting fluid flow data. In such an embodiment, ultraphobic fluid contact surface 20 may be formed on a sensor utilizing a paddle wheel, turbine, magnet or other flow sensing device commonly used in industry.

In sum, it will be appreciated that ultraphobic fluid contact surface 20 may be applied to any fluid handling component where such properties may be desirable. Other examples of such fluid handling components may include fluid moving devices such as pumps, nozzles, weirs, and hydraulic components such as cylinders. It will also be readily appreciated that the ultraphobic fluid contact surface 20 of the present invention may be advantageously applied to microfluidic fluid handling components, particularly where higher fluid pressures may be used.

Figure 1H:
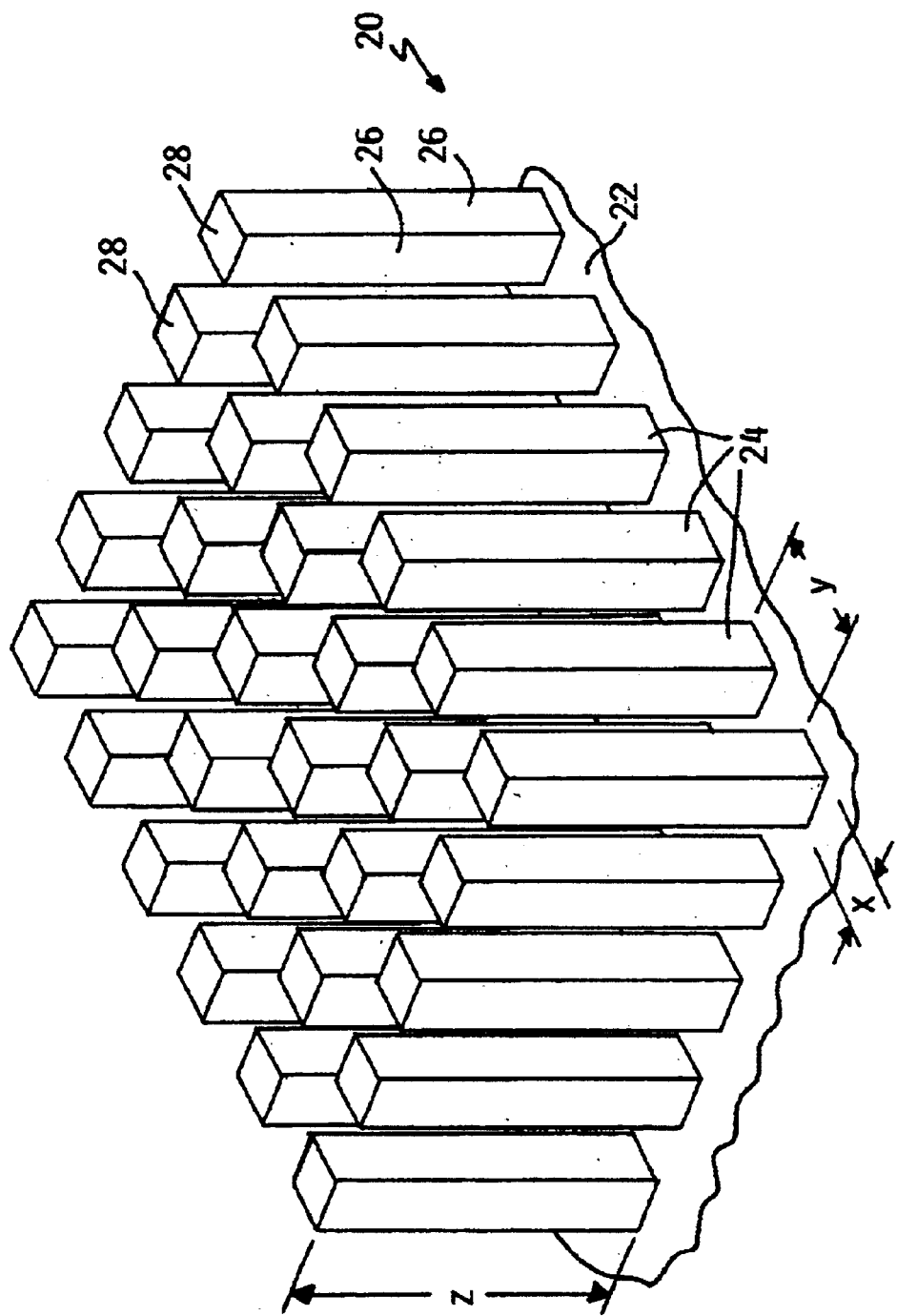
FIG. 1h is a perspective, greatly enlarged view of an ultraphobic surface according to the present invention, wherein a multiplicity of nano/micro scale asperities are arranged in a rectangular array.

Turning now to FIG. 1h, a greatly enlarged view of ultraphobic fluid contact surface 20 is depicted. The surface 20 generally includes a substrate 22 with a multiplicity of projecting asperities 24. Each asperity 24 has a plurality of sides 26 and a top 28. Each asperity 24 has a width dimension, annotated "x" in the figures, and a height dimension, annotated "z" in the figures.

As depicted in FIGS. 1h–3, asperities 24 are disposed in a regular rectangular array, each asperity spaced apart from the adjacent asperities by a spacing dimension, annotated "y" in the figures. The angle subtended by the top edge 30 of the asperities 24 is annotated $\phi$, and the rise angle of the side 26 of the asperities 24 relative to the substrate 22 is annotated $\omega$. The sum of the angles $\phi$ and $\omega$ is 180 degrees.

Figure 7:
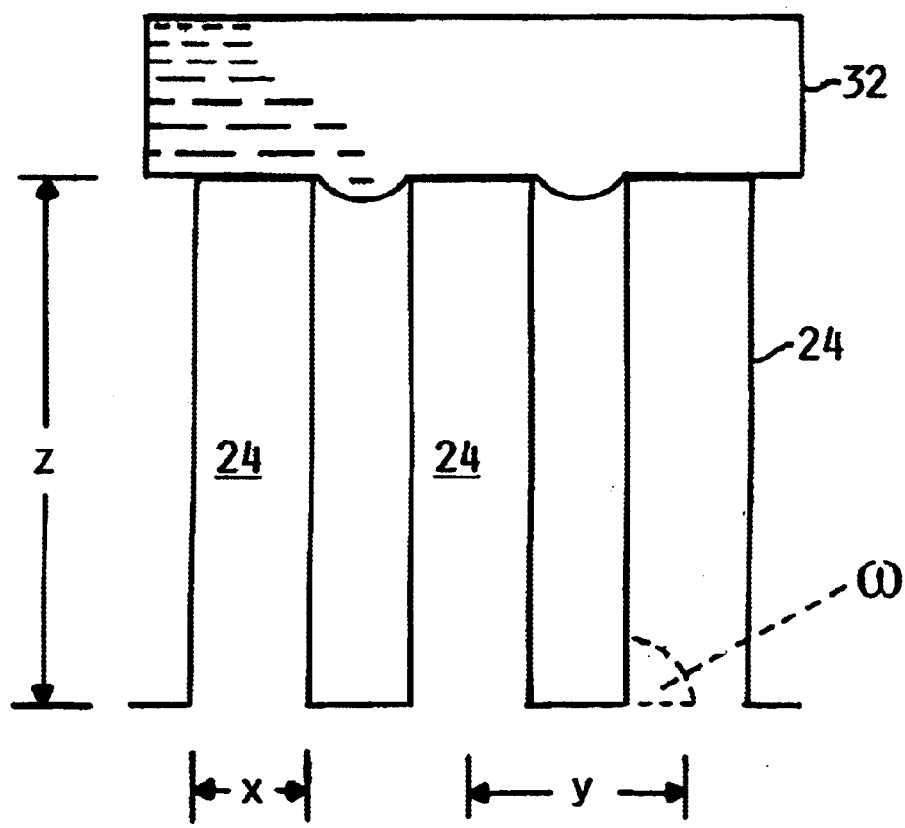
FIG. 7 is a side elevation view depicting a quantity of liquid suspended atop asperities.
Figure 8:
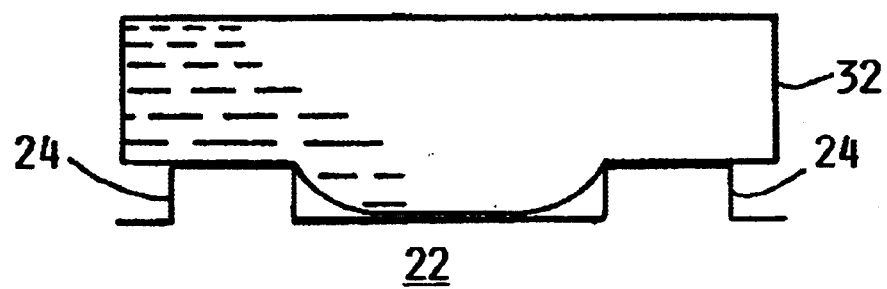
FIG. 8 is a side elevation view depicting the liquid contacting the bottom of the space between asperities.

Generally, ultraphobic fluid contact surface 20 will exhibit ultraphobic properties when a liquid-solid-gas interface is maintained at the surface. As depicted in FIG. 7, if liquid 32 contacts only the tops 28 and a portion of the sides 26 proximate top edge 30 of asperities 24, leaving a space 34 between the asperities filled with air or other gas, the requisite liquid-solid-gas interface is present. The liquid may be said to be "suspended" atop and between the top edges 30 of the asperities 24.

As will be disclosed hereinbelow, the formation of the liquid-solid-gas interface depends on certain interrelated geometrical parameters of the asperities 24, the properties of the liquid, and the interaction of the liquid with the solid surface. According to the present invention, the geometrical properties of asperities 24 may be selected so that the surface 20 exhibits ultraphobic properties at any desired liquid pressure.

Referring to the rectangular array of FIGS. 1h–3, surface 20 may be divided into uniform areas 36, depicted bounded by dashed lines, surrounding each asperity 24. The area density of asperities (δ) in each uniform area 36 may be described by the equation:

$$\delta = \frac{1}{y^2}, \tag{1}$$

where y is the spacing between asperities measured in meters.

For asperities 24 with a square cross-section as depicted in FIGS. 1h–3, the length of perimeter (p) of top 28 at top edge 30:

$$p=4x, \tag{2}$$

where x is the asperity width in meters.

Perimeter p may be referred to as a "contact line" defining the location of the liquid-solid-gas interface. The contact line density (Λ) of the surface, which is the length of contact line per unit area of the surface, is the product of the perimeter (p) and the area density of asperities (δ) so that:

$$\Lambda = p\delta. \tag{3}$$

Figure 3:
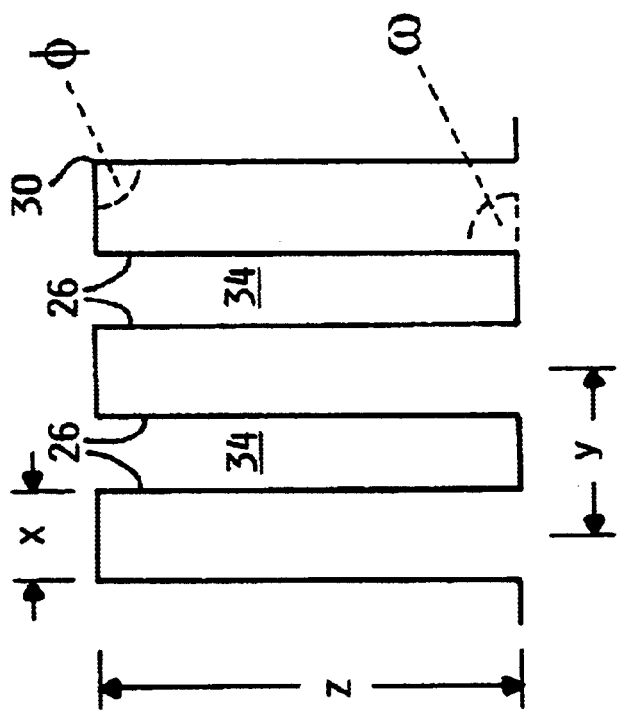
FIG. 3 is a side elevation view of the surface portion depicted in FIG. 2.
Figure 2:
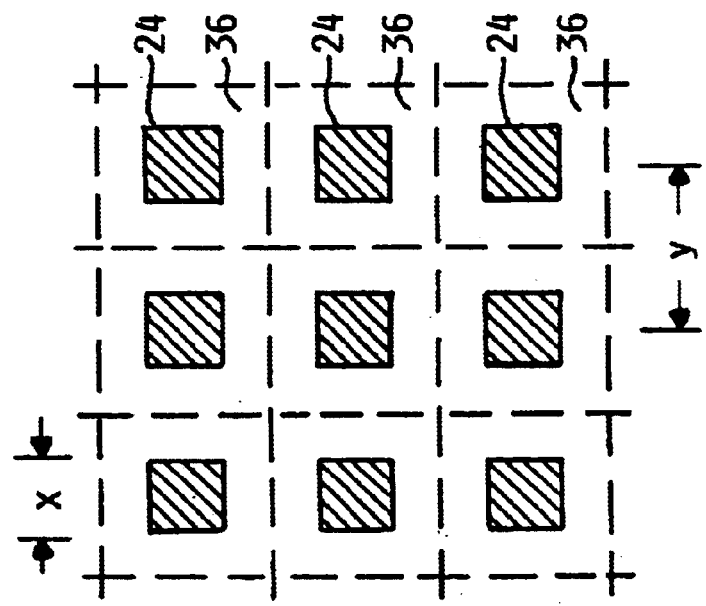
FIG. 2 is a top plan view of a portion of the surface of FIG. 1.

For the rectangular array of square asperities depicted in FIGS. 1–3:

$$\Lambda = 4x/y^2. \tag{4}$$

A quantity of liquid will be suspended atop asperities 24 if the body forces (F) due to gravity acting on the liquid are less than surface forces (f) acting at the contact line with the asperities. Body forces (F) associated with gravity may be determined according to the following formula:

$$F=\rho gh, \tag{5}$$

where (ρ) is the density of the liquid, (g) is the acceleration due to gravity, and (h) is the depth of the liquid. Thus, for example, for a 10 meter column of water having an approximate density of 1000 kg/M³, the body forces (F) would be:

$$F=(1000 \text{ kg/m}^3)(9.8 \text{ m/s}^2)(10 \text{ m})=9.8\times10^4 \text{ kg/m}^2\text{-s}.$$

On the other hand, the surface forces (f) depend on the surface tension of the liquid (γ), its apparent contact angle with the side 26 of the asperities 24 with respect to the vertical $\theta_S$, the contact line density of the asperities (Λ) and the apparent contact area of the liquid (A):

$$f=-\Lambda A\gamma \cos \theta_S. \tag{6}$$

The true advancing contact angle $(\theta_{a,0})$ of a liquid on a given solid material is defined as the largest experimentally measured stationary contact angle of the liquid on a surface of the material having essentially no asperities. The true advancing contact angle is readily measurable by techniques well known in the art.

Suspended drops on a surface with asperities exhibit their true advancing contact angle value $(\theta_{a,0})$ at the sides of the asperities. The contact angle with respect to the vertical at the side of the asperities $(\theta_S)$ is related to the true advancing contact angle $(\theta_{a,0})$ by φ or ω as follows:

$$\theta_S=\theta_{a,0}+90°-\phi=\theta_{a,0}+\omega-90°. \tag{7}$$

By equating F and f and solving for contact line density Λ, a critical contact line density parameter $\Lambda_L$ may be determined for predicting ultraphobic properties in a surface:

$$\Lambda_L = \frac{-\rho gh}{\gamma \cos(\theta_{a,0}+\omega-90°)}, \tag{8}$$

where (ρ) is the density of the liquid, (g) is the acceleration due to gravity, (h) is the depth of the liquid, the surface tension of the liquid (γ), ω is the rise angle of the side of the asperities relative to the substrate in degrees, and $(\theta_{a,0})$ is the experimentally measured true advancing contact angle of the liquid on the asperity material in degrees.

If $\Lambda>\Lambda_L$, the liquid will be suspended atop the asperities 24, producing an ultraphobic surface. Otherwise, if $\Lambda<\Lambda_L$, the liquid will collapse over the asperities and the contact interface at the surface will be solely liquid/solid, without ultraphobic properties.

It will be appreciated that by substituting an appropriate value in the numerator of the equation given above, a value of critical contact line density may be determined to design a surface that will retain ultraphobic properties at any desired amount of pressure. The equation may be generalized as:

$$\Lambda_L = \frac{-P}{\gamma \cos(\theta_{a,0}+\omega-90°)}, \tag{9}$$

where P is the maximum pressure under which the surface must exhibit ultraphobic properties in kilograms per square meter, γ is the surface tension of the liquid in Newtons per meter, $\theta_{a,0}$ is the experimentally measured true advancing contact angle of the liquid on the asperity material in degrees, and ω is the asperity rise angle in degrees.

It is generally anticipated that a surface 20 formed according to the above relations will exhibit ultraphobic properties under any liquid pressure values up to and including the value of P used in equation (9) above. The ultraphobic properties will be exhibited whether the surface is submerged, subjected to a jet or spray of liquid, or impacted with individual droplets.

According to the above relations, surface 20 will exhibit ultraphobic properties at a liquid pressure of one atmosphere, equal to about 10,330 kg/m², where the contact line density Λ of surface 20 equals or exceeds a critical contact line density $\Lambda_L$ determined as follows:

$$\Lambda_L = \frac{-10,330}{\gamma \cos(\theta_{a,0}+\omega-90°)}, \tag{10}$$

where γ is the surface tension of the liquid in Newtons per meter, $\theta_{a,0}$ is the experimentally measured true advancing contact angle of the liquid on the asperity material in degrees, and ω is the asperity rise angle in degrees.

Once the value of critical contact line density is determined, the remaining details of the geometry of the asperities may be determined according to the relationship of x and y given in the equation for contact line density. In other words, the geometry of the surface may be determined by choosing the value of either x or y in the contact line equation and solving for the other variable.

The liquid interface deflects downwardly between adjacent asperities by an amount $D_1$ as depicted in FIG. 6. If the amount $D_1$ is greater than the height (z) of the asperities 24, the liquid will contact the substrate 22 at a point between the asperities 24. If this occurs, the liquid will be drawn into space 34, and collapse over the asperities, destroying the ultraphobic character of the surface. The value of $D_1$ represents a critical asperity height ($Z_c$), and is determinable according to the following formula:

$$D_1 = Z_c = \frac{d(1 - \cos(\theta_{a,0} + \omega - 180°))}{2 \sin(\theta_{a,0} + \omega - 180°)}, \tag{11}$$

where (d) is the distance between adjacent asperities, $\omega$ is the asperity rise angle, and $\theta_{a,0}$ is the experimentally measured true advancing contact angle of the liquid on the asperity material. The height (z) of asperities 24 must be at least equal to, and is preferably greater than, critical asperity height ($Z_c$).

Figure 9:
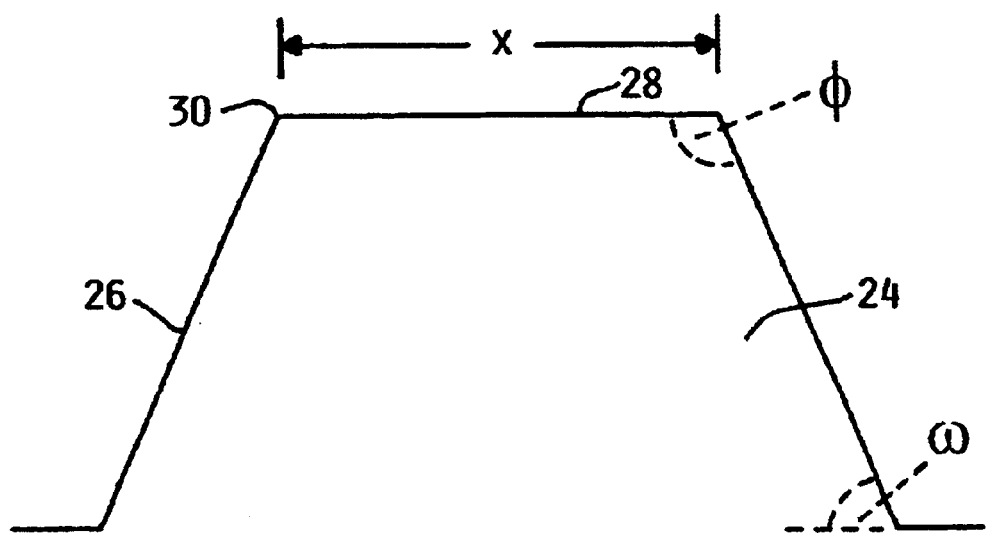
FIG. 9 is a side elevation view of a single asperity in an alternative embodiment of the invention wherein the asperity rise angle is an acute angle.
Figure 10:
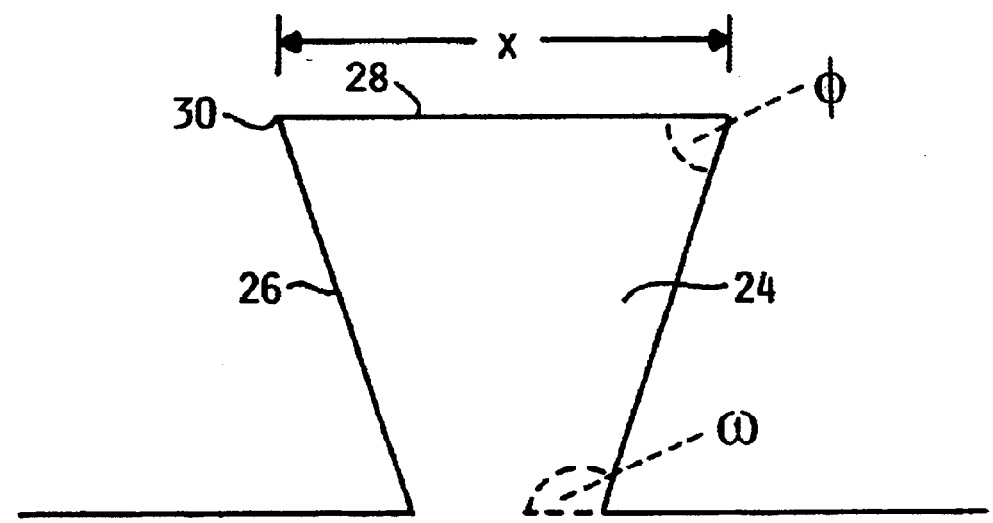
FIG. 10 is a side elevation view of a single asperity in an alternative embodiment of the invention wherein the asperity rise angle is an obtuse angle.

Although in FIGS. 1h–3 the asperity rise angle $\omega$ is 90 degrees, other asperity geometries are possible. For example, $\omega$ may be an acute angle as depicted in FIG. 9 or an obtuse angle as depicted in FIG. 10. Generally, it is preferred that $\omega$ be between 80 and 130 degrees.

It will also be appreciated that a wide variety of asperity shapes and arrangements are possible within the scope of the present invention. For example, asperities may be polyhedral, cylindrical as depicted in FIGS. 11–12, cylindroid, or any other suitable three dimensional shape. In addition, various strategies may be utilized to maximize contact line density of the asperities. As depicted in FIGS. 14 and 15, the asperities 24 may be formed with a base portion 38 and a head portion 40. The larger perimeter of head portion 40 at top edge 30 increases the contact line density of the surface. Also, features such as recesses 42 may be formed in the asperities 24 as depicted in FIG. 16 to increase the perimeter at top edge 30, thereby increasing contact line density. The asperities may also be cavities formed in the substrate.

The asperities may be arranged in a rectangular array as discussed above, in a polygonal array such as the hexagonal array depicted in FIGS. 4–5, or a circular or ovoid arrangement. The asperities may also be randomly distributed so long as the critical contact line density is maintained, although such a random arrangement may have less predictable ultraphobic properties, and is therefore less preferred. In such a random-arrangement of asperities, the critical contact line density and other relevant parameters may be conceptualized as averages for the surface. In the table of FIG. 13, formulas for calculating contact line densities for various other asperity shapes and arrangements are listed.

Generally, the substrate material may be any material upon which micro or nano scale asperities may be suitably formed. The asperities may be formed directly in the substrate material itself, or in one or more layers of other material deposited on the substrate material, by photolithography or any of a variety of suitable methods. Direct extrusion may be used to form asperities in the form of parallel ridges. A photolithography method that may be suitable for forming micro/nanoscale asperities is disclosed in PCT Patent Application Publication WO 02/084340, hereby fully incorporated herein by reference.

Other methods that may be suitable for forming asperities of the desired shape and spacing include nanomachining as disclosed in U.S. Patent Application Publication No. 2002/00334879, microstamping as disclosed in U.S. Pat. No. 5,725,788, microcontact printing as disclosed in U.S. Pat. No. 5,900,160, self-assembled metal colloid monolayers, as disclosed in U.S. Pat. No. 5,609,907, microstamping as disclosed in U.S. Pat. No. 6,444,254, atomic force microscopy nanomachining as disclosed in U.S. Pat. No. 5,252,835, nanomachining as disclosed in U.S. Pat. No. 6,403,388, sol-gel molding as disclosed in U.S. Pat. No. 6,530,554, self-assembled monolayer directed patterning of surfaces, as disclosed in U.S. Pat. No. 6,518,168, chemical etching as disclosed in U.S. Pat. No. 6,541,389, or sol-gel stamping as disclosed in U.S. Patent Application Publication No. 2003/0047822, all of which are hereby fully incorporated herein by reference. Carbon nanotube structures may also be usable to form the desired asperity geometries. Examples of carbon nanotube structures are disclosed in U.S. Patent Application Publication Nos. 2002/0098135 and 2002/0136683, also hereby fully incorporated herein by reference. Also, suitable asperity structures may be formed using known methods of printing with colloidal inks. Of course, it will be appreciated that any other method by which micro/nanoscale asperities may be accurately formed may also be used.

In some applications, particularly where the component will not be subjected to high fluid pressures, ultraphobic surface 20 may be formed with a coating of polymer material applied using known chemical vapor deposition or chemical surface modification techniques. For example, a thin layer of a low surface energy material may be applied to the surfaces of a component using gas phase polymerization. For the purposes of the present application, a low surface energy material is generally any material having a surface energy value lower than about 35 mN/m. The resulting ultraphobic surface 20 will be generally characterized by randomly shaped and arranged asperities formed in the low surface energy material. Alternatively, the component surfaces may be subjected to a chemical surface modification process, such as cold oxygen plasma, or corona discharge treatment. In sum, any process capable of producing randomly shaped and arranged asperities having the desired contact line density may be used and is contemplated within the scope of the invention.

In another embodiment for low fluid pressure applications, a fractal ultraphobic surface may be formed as a layer of material on the substrate. In one such embodiment, a layer of alkylketene dimer (AKD) or similar material may be melted or poured on the polymer substrate and allowed to harden in a nitrogen gas atmosphere. One suitable method for forming an AKD surface is more fully described by T. Onda, et.al., in an article entitled "Super Water Repellant Fractal Surfaces", Langmuir, Volume 12, Number 9, May 1, 1996, at page 2125, which article is fully incorporated herein by reference.

In another embodiment suitable for low fluid pressure applications, polymer material, such as polypropylene, may be dissolved in a solvent, such as p-xylene. A quantity of non-solvent such as methyl ethyl ketone may be added to the solution, and the solution deposited on the component substrate. When the solvent is evaporated, a porous, gel-like ultraphobic surface structure will result.

In each of the above polymer layers, the resulting surface will be generally characterized by randomly shaped and arranged asperities. Although the actual contact line density and critical contact line density values for such surfaces are difficult to determine due to the variations in individual asperities, these surfaces will exhibit ultraphobic properties if the contact line density value for the surface equals or exceeds the critical contact line density for the surface. For such surfaces, the actual contact line density will necessarily be an average value for the surface due to the variability of dimensions and geometry of individual asperities. In addition, asperity rise angle $\omega$ in equations 9 and 11 should be an average value for the surface.

It is anticipated that fluid handling components having ultraphobic fluid contact surfaces 20 will exhibit sharply reduced fluid friction characteristics, particularly at small cross-sectional areas and small fluid masses, leading to greatly improved fluid handling system efficiencies and improved fluid flow throughput. Drainability will be greatly enhanced due to the tendency of the surface to suspend droplets, causing them to roll freely by gravity in the direction of any surface slope. The ultraphobic surfaces will be durable, and capable of exhibiting ultraphobic properties under fluid pressures up to the design pressure selected according to the method outlined above.

Other beneficial properties are also anticipated. For example, ultraphobic fluid contact surfaces 20 are anticipated to be resistant to bio-film growth, due to the tendency of the surface to repel liquid water. As a result, the fluid handling components of the present application have applications where inhibition of bio-film growth is desirable, such as for example warm water storage and circulating systems.

What is claimed is:

1. A fluid handling component comprising:
a body having at least one fluid contact surface portion, said fluid contact surface portion including a substrate with a multiplicity of substantially uniformly shaped asperities thereon, each asperity having a common asperity rise angle relative to the substrate, the asperities positioned so that the surface has a contact line density measured in meters of contact line per square meter of surface area equal to or greater than a contact line density value "$\Lambda_L$" determined according to the formula:

$$\Lambda_L = \frac{-10,330}{\gamma\cos(\theta_{a,0} + \omega - 90°)}$$

where $\gamma$ is the surface tension of a fluid in contact with the surface in Newtons per meter, $\theta_{a,0}$ is the experimentally measured true advancing contact angle of the fluid on the asperity material in degrees, and $\omega$ is the asperity rise angle in degrees, wherein the surface exhibits a liquid-solid-gas interface with the fluid at a pressure of at least one atmosphere.

2. The component of claim 1, wherein the asperities are projections.

3. The component of claim 2, wherein the asperities are polyhedrally shaped.

4. The component of claim 2, wherein each asperity has a generally square transverse cross-section.

5. The component of claim 2, wherein the asperities are cylindrical or cylindroidally shaped.

6. The component of claim 1, wherein the asperities are cavities formed in the substrate.

7. The component of claim 1, wherein the asperities are positioned in a substantially uniform array.

8. The component of claim 7, wherein the asperities are positioned in a rectangular array.

9. The component of claim 1, wherein the asperities are parallel ridges.

10. The component of claim 1, wherein the asperities have a substantially uniform asperity height relative to the substrate portion, and wherein the asperity height is greater than a critical asperity height value "$Z_c$" in meters determined according to the formula:

$$Z_c = \frac{d(1 - \cos(\theta_{a,0} + \omega - 180°))}{2\sin(\theta_{a,0} + \omega - 180°)}$$

where d is the distance in meters between adjacent asperities, $\theta_{a,0}$ is the experimentally measured true advancing contact angle of the liquid on the asperity material in degrees, and $\omega$ so is the asperity rise angle in degrees.

11. The component of claim 1, wherein the component includes a tube having a bore with an inner surface, and wherein the at least one fluid contact surface portion is on said inner surface.

12. The component of claim 1, wherein the component is a valve.

13. The component of claim 1, wherein the component is a fluid moving device.

14. The component of claim 13, wherein the fluid moving device is a pump.

15. A process of making a fluid handling component having an ultraphobic fluid contact surface adapted for repelling a liquid at a pressure of at least one atmosphere in contact with the surface, the process comprising:
providing a fluid handling component including a substrate having an outer surface; and
forming a multiplicity of substantially uniformly shaped asperities on the outer surface of the substrate, each asperity having a common asperity rise angle relative to the substrate portion, the asperities positioned so that the surface has a contact line density measured in meters of contact line per square meter of surface area equal to or greater than a contact line density value "$\Lambda_L$" determined according to the formula:

$$\Lambda_L = \frac{-10,330}{\gamma\cos(\theta_{a,0} + \omega - 90°)}$$

where $\gamma$ is the surface tension of the liquid in Newtons per meter, $\theta_{a,0}$ is the experimentally measured true advancing contact angle of the liquid on the asperity material in degrees, and $\omega$ is the asperity rise angle in degrees.

16. The process of claim 15, wherein the asperities are formed by photolithography.

17. The process of claim 15, wherein the asperities are formed by a process selected from the group consisting of nanomachining, microstamping, microcontact printing, self-assembling metal colloid monolayers, atomic force microscopy nanomachining, sol-gel molding, self-assembled monolayer directed patterning, chemical etching, sol-gel stamping, printing with colloidal inks, and disposing a layer of parallel carbon nanotubes on the substrate.

18. A process for producing a fluid handling component having a fluid contact surface with ultraphobic properties at liquid pressures up to a predetermined pressure value, the process comprising:
selecting an asperity rise angle;
determining a critical contact line density "$\Lambda_L$" value according to the formula:

$$\Lambda_L = \frac{-P}{\gamma\cos(\theta_{a,0} + \omega - 90°)}$$

where P is the predetermined pressure value, $\gamma$ is the surface tension of the liquid, $\theta_{a,0}$ is the experimentally measured true advancing contact angle of the liquid on the asperity material in degrees, and $\omega$ is the asperity rise angle;
providing a fluid handling component having a substrate; and
forming a multiplicity of projecting asperities on the substrate so that the surface has an actual contact line density equal to or greater than the critical contact line density.

19. The process of claim 18, wherein the asperities are formed using photolithography.

20. The process of claim 18, wherein the asperities are formed by extrusion.

21. The process of claim 18, wherein the asperities are formed using nanomachining, microstamping, microcontact printing, self-assembling metal colloid monolayers, atomic force microscopy nanomachining, sol-gel molding, self-assembled monolayer directed patterning, chemical etching, sol-gel stamping, printing with colloidal inks, or by disposing a layer of carbon nanotubes on the substrate.

22. The process of claim 18, further comprising the step of selecting a geometrical shape for the asperities.

23. The process of claim 18, further comprising the step of selecting an array pattern for the asperities.

24. The process of claim 18, further comprising the steps of selecting at least one dimension for the asperities and determining at least one other dimension for the asperities using an equation for contact line density.

25. The process of claim 18, further comprising the step of determining a critical asperity height value "$Z_c$" in meters according to the formula:

$$Z_c = \frac{d(1 - \cos(\theta_{a,0} + \omega - 180°))}{2\sin(\theta_{a,0} + \omega - 180°)}$$

where d is the distance in meters between adjacent asperities, $\theta_{a,0}$ is the true advancing contact angle of the liquid on the surface in degrees, and ω is the asperity rise angle in degrees.

26. A fluid handling system comprising:

at least one fluid handling component including a body with at least one fluid contact surface portion, said fluid contact surface portion including a substrate with a multiplicity of substantially uniformly shaped asperities thereon, each asperity having a common asperity rise angle relative to the substrate, the asperities positioned so that the surface has a contact line density measured in meters of contact line per square meter of surface area equal to or greater than a contact line density value "$\Lambda_L$" determined according to the formula:

$$\Lambda_L = \frac{-10,330}{\gamma \cos(\theta_{a,0} + \omega - 90°)}$$

where γ is the surface tension of a fluid in contact with the surface in Newtons per meter, $\theta_{a,0}$ is the experimentally measured true advancing contact angle of the fluid on the asperity material in degrees, and ω is the asperity rise angle in degrees, wherein the surface exhibits a liquid-solid-gas interface with the fluid at a pressure of at least one atmosphere.

27. The system of claim 26, wherein the asperities are projections.

28. The system of claim 27, wherein the asperities are polyhedrally shaped.

29. The system of claim 27, wherein each asperity has a generally square transverse cross-section.

30. The system of claim 27, wherein the asperities are cylindrical or cylindroidally shaped.

31. The system of claim 26, wherein the asperities are cavities formed in the substrate.

32. The system of claim 26, wherein the asperities are positioned in a substantially uniform array.

33. The system of claim 32, wherein the asperities are positioned in a rectangular array.

34. The system of claim 26, wherein the asperities have a substantially uniform asperity height relative to the substrate portion, and wherein the asperity height is greater than a critical asperity height value "$Z_c$" in meters determined according to the formula:

$$Z_c = \frac{d(1 - \cos(\theta_{a,0} + \omega - 180°))}{2\sin(\theta_{a,0} + \omega - 180°)}$$

where d is the distance in meters between adjacent asperities, $\theta_{a,0}$ is the experimentally measured true advancing contact angle of the liquid on the asperity material in degrees, and ω is the asperity rise angle in degrees.

35. The system of claim 26, wherein the component includes a tube having a bore with an inner surface, and wherein the at least one fluid contact surface portion is on said inner surface.

36. The component of claim 26, wherein the component is a valve.

37. The component of claim 26, wherein the component is a fluid moving device.

38. The component of claim 37, wherein the fluid moving device is a pump.

* * * * *